US008260600B1

(12) United States Patent
Deng et al.

(10) Patent No.: US 8,260,600 B1
(45) Date of Patent: Sep. 4, 2012

(54) CIRCUIT SIMULATOR

(75) Inventors: Linzhong Deng, Sunnyvale, CA (US); Bruce McGaughy, Fremont, CA (US)

(73) Assignee: Proplus Design Solutions, Inc., San Jose, CA (US)

( * ) Notice: Subject to any disclaimer, the term of this patent is extended or adjusted under 35 U.S.C. 154(b) by 915 days.

(21) Appl. No.: 12/245,706

(22) Filed: Oct. 4, 2008

Related U.S. Application Data

(60) Provisional application No. 60/977,972, filed on Oct. 5, 2007, provisional application No. 60/977,976, filed on Oct. 5, 2007, provisional application No. 60/977,981, filed on Oct. 5, 2007.

(51) Int. Cl.
*G06F 17/50* (2006.01)
(52) U.S. Cl. ............ 703/14; 716/100; 716/101
(58) Field of Classification Search ........ 703/13, 703/14; 716/100, 101
See application file for complete search history.

(56) References Cited

U.S. PATENT DOCUMENTS

| | | | | |
|---|---|---|---|---|
| 6,182,270 | B1 * | 1/2001 | Feldmann et al. | 716/136 |
| 6,577,992 | B1 * | 6/2003 | Tcherniaev et al. | 703/14 |
| 2006/0161413 | A1 * | 7/2006 | Wei et al. | 703/14 |
| 2008/0010329 | A1 * | 1/2008 | Kuwada | 708/200 |

OTHER PUBLICATIONS

Amestoy, P, et al., "A fully asynchronous multifrontal solver using distributed dynamic scheduling", PARASOL Project (ESPIRIT IV LTR Project No. 21060), France, Jun. 10, 1999, p. 1-29.
Nakjima, K, "Convergence Acceleration Method of Large-Scale Parallel Iterative Solvers for . . . ", Proceedings of ACES 1st Inaugural Workshop, Australia, 1999, p. 339-344.
Buttari et al., "Using Mixed Precision for Sparse Matrix Computations . . . ", http://citeseerx.ist.psu.edu/viewdoc/download?doi=10.1.1.98.4405&rep=rep1&type=pdf, Oct. 26, 2006, p. 1-26.
Demmel, J., "A Supernodal Approach to Sparse Partial Pivoting", Siam J. Matrix Anal. Appl., vol. 20, No. 3, p. 720-755, 1999.

* cited by examiner

*Primary Examiner* — Dwin M Craig
*Assistant Examiner* — Andre Pierre Louis
(74) *Attorney, Agent, or Firm* — Silicon Valley Patent Group; Thomas Chan (57) ABSTRACT

Method and system are disclosed for simulating a circuit. The method includes representing a circuit using a matrix that represents a set of linear equations to be solved, identifying a delta matrix, which is a subset of the matrix that changed states from a previous time step to a current time step, computing an update of the delta matrix using a matrix decomposition approach, generating a current state of the matrix using a previous state of the matrix and the update of the delta matrix, and storing the current state of the matrix in a memory device.

17 Claims, 9 Drawing Sheets

Step 0: $R_0$

Step 1: $R_0$ $R_1$

Step ...

Step i: $R_i$ $R_{i-1}$ $R_{i-2}$ ... $R_2$ $R_1$ $R_0$

Figure 9

CIRCUIT SIMULATOR

CROSS-REFERENCE TO RELATED APPLICATIONS

This application claims the priority and benefit of provisional applications 60/977,972, "Divide Conquer Project Introduction," filed on Oct. 5, 2007; 60/977,976, "Schur and UD Flow," filed on Oct. 5, 2007; and 60/977,981, "RAPT Flow," filed on Oct. 5, 2007, which are incorporated herein in their entirety by reference.

FIELD OF THE INVENTION

The present invention relates to the field of electronic design automation tools. In particular, the present invention relates to methods and system for simulating a circuit

BACKGROUND OF THE INVENTION

An integrated circuit is a network of circuit elements such as resistors, capacitors, inductors, mutual inductors, transmission lines, diodes, bipolar junction transistors (BJT), junction field effect transistors (JFET), metal-oxide-semiconductor field effect transistors (MOSFET), metal-semiconductor field effect transistors (MESFET), thin-film transistors (TFT), etc.

The development of complicated integrated circuits often requires powerful numerical simulation programs. For example, circuit simulation is an essential part in the design flow of integrated circuits, helping circuit designers to verify the functionality and performance of their designs without going through expensive fabrication processes. As the semiconductor processing technology migrates to nanometer dimensions, new simulation methodologies are needed to solve the new problems intrinsically existing in circuit design with nanometer features. Modern integrated circuits continually challenge circuit simulation algorithms and implementations in the development of new technology generations. The semiconductor industry requires EDA software with the ability to analyze nanometer effects like coupling noise, ground bounce, transmission line wave propagation, dynamic leakage current, supply voltage drop, and nonlinear device and circuit behavior, which are all related to dynamic current. Thus, detailed circuit simulation and transistor-level simulation have become one of the most effective ways to investigate and resolve issues with nanometer designs.

Examples of electronic circuit simulators include the Simulation Program with Integrated Circuit Emphasis (SPICE) developed at the University of California, Berkeley (UC Berkeley), and various enhanced versions or derivatives of SPICE. SPICE and its derivatives or enhanced versions will be referred to hereafter as SPICE circuit simulators, or SPICE.

SPICE-like simulations may provide fairly accurate predictions of how corresponding circuits will behave when actually built. The predictions are preferably made not only for individual sub-circuit but also for whole systems (e.g., whole integrated circuits) so that system-wide problems relating to noise and the like may be uncovered and dealt with. In a general process flow of a SPICE-like simulation, an analog integrated circuit under simulation is often represented in the form of a netlist description. A netlist is a circuit description of the analog circuit to be simulated written in a SPICE-like language. SPICE netlists are pure structural languages with simulation control statements. Other language like Verilog-A™ has the capability to include behavioral constructs. The structural netlist of SPICE together with a predefined set of circuit components of the analog integrated circuit may be represented in the form of a matrix in accordance with certain circuit modeling methodologies (which is not a concern of the present invention). The number of nonlinear differential equations ranges from 1 to n. There are a corresponding number of input vectors to be operated by the linear equation. The set of input vectors are shown as $\{I_1, I_2, \ldots I_n\}$. Next, the linear matrix is computed with the set of input vectors to generate a set of solution vectors $\{V_1, V_2, \ldots V_n\}$. The computation is repeated until the set of solutions converge. The set of solutions may be then displayed in the form of waveforms, measurements, or checks on a computer screen for engineers to inspect the simulation results.

However, SPICE-like simulation of a whole system becomes more difficult and problematic as the industry continues its relentless trek of scaling down to smaller and smaller device geometries and of cramming more interconnected components into the system. An example of such down scaling is the recent shift from micron-sized channels toward deep submicron sized transistor channel lengths. Because of the smaller device geometries, a circuit designer are able to cram exponentially larger numbers of circuit components (e.g., transistors, diodes, capacitors) into a given integrated circuit (IC), and therefore increases the matrix size to a complexity which may not be solved in a desired time frame.

SPICE models a circuit in a node/element fashion, i.e., the circuit is regarded as a collection of various circuit elements connected at nodes. At the heart of SPICE is the so-called Nodal Analysis, which is accomplished by formulating nodal equations (or circuit equations) in matrix format to represent the circuit and by solving these nodal equations. The circuit elements are modeled by device models, which produce model results that are represented in the circuit equations as matrices.

A device model for modeling a circuit element, such as the SPICE model for modeling MOSFET devices, developed by UC Berkeley, typically includes model equations and a set of model parameters that mathematically represent characteristics of the circuit element under various bias conditions. For example, a circuit element with n terminals can be modeled by the following current-voltage relations:

$$I_i = f_i(V_1, \ldots, V_n, t) \text{ for } i=1, \ldots, n,$$

where $I_i$ represents the current entering terminal 1; $V_j(j=1, \ldots, n)$ represents the voltage or terminal bias across terminal j and a reference terminal, such as the ground; and t represents the time. The Kirchhoff's Current Law implies that the current entering terminal n is given by $$I_n = \sum_{i=1}^{n-1} I_i.$$

A conductance matrix of the circuit element is defined by:

$$G(V_1, \ldots, V_n, t) := \begin{pmatrix} \frac{\partial f_1}{\partial V_1} & \cdots & \frac{\partial f_1}{\partial V_n} \\ \vdots & \ddots & \vdots \\ \frac{\partial f_n}{\partial V_1} & \cdots & \frac{\partial f_n}{\partial V_n} \end{pmatrix}.$$

To model the circuit element under alternating current (AC) operations, the device model also considers the relationship between node charges and the terminal biases:

$$Q_i = q_i(V_1, \ldots, V_n, t) \text{ for } i = 1, \ldots, n.$$

where $Q_i$ represents the node charge at terminal i. Thus, the capacitance matrix of the n-terminal circuit element is defined by $$C(V_1, \ldots, V_n, t) := \begin{pmatrix} \frac{\partial q_1}{\partial V_1} & \cdots & \frac{\partial q_1}{\partial V_n} \\ \vdots & \ddots & \vdots \\ \frac{\partial q_n}{\partial V_1} & \cdots & \frac{\partial q_n}{\partial V_n} \end{pmatrix}.$$

The SPICE method considers a circuit as a non-divided object. A circuit may be represented as a large numerically discrete nonlinear matrix for analyzing instant current. The matrix dimension is of the same order as the number of the nodes in the circuit. For transient analysis, this giant nonlinear system needs to solve hundreds of thousand times, thus restricting the capacity and performance of the SPICE method. The SPICE method in general can simulate a circuit up to about 50,000 nodes. Therefore it is not practical to use the SPICE method in full chip design. It is widely used in cell design, library building, and accuracy verification.

With some accuracy lost, the Fast SPICE method developed in the early 1990s provides capacity and speed about two orders of magnitude greater than the SPICE method. The performance gain was made by employing simplified models, circuit partition methods, and event-driven algorithms, and by taking advantage of circuit latency.

However, the assumptions made by the Fast SPICE method about circuit latency become questionable for nanometer designs because some subcircuits may have been functionally latent and yet electrically active because of voltage variation in Vdd and Gnd busses or in small crosstalk coupling signals. Also, the event-driven algorithm used by the Fast SPICE method is generally insufficient to handle analog signal propagation. Fast SPICE's capacity is limited to a circuit size considerably less than ten million transistors. It is therefore inadequate for full chip simulations for large circuits. Furthermore, the simulation time increases drastically with the presence of many bipolar junction transistors (BJTs), inductors, diodes, or a substantial number of cross coupling capacitors.

Thus, management and optimization of timing, power, and reliability become challenging tasks in nanometer designs because the conventional timing, power, and reliability analysis methods are insufficient to handle new features and new semiconductor processing technologies. Some effects like variability in production, circuit complexity, and significant parasitic effects need to be considered in a new light. Therefore, there is a need for a method and system that address the issues of the conventional simulation systems described above.

SUMMARY

Methods and system for simulating a circuit are disclosed. In one embodiment, the method for simulating a circuit includes representing a circuit using a matrix, where the matrix represents a set of linear equations to be solved, identifying a delta matrix, which is a subset of the matrix that changed states from a previous time step to a current time step, computing an update of the delta matrix using a matrix decomposition approach, generating a current state of the matrix using a previous state of the matrix and the update of the delta matrix, and storing the current state of the matrix in a memory device.

In another embodiment, a system for simulating a circuit includes a graphics processing unit (GPU) having one or more multiprocessors and each multiprocessor includes a plurality of processors and a shared memory configured to be used by the plurality of processors, a graphical-user-interface for viewing representations of the matrix on a display, and a global memory for storing information related to the matrix. The system further includes logic for representing a circuit using a matrix, where the matrix represents a set of linear equations to be solved, logic for identifying a delta matrix which is a subset of the matrix that changed states from a previous time step to a current time step, logic for computing an update of the delta matrix using a matrix decomposition approach, logic for generating a current state of the matrix using a previous state of the matrix and the update of the delta matrix, and logic for storing the current state of the matrix in a memory device.

In yet another embodiment, a method for simulating a circuit includes receiving a description of the circuit in a netlist, computing a circuit topology from the netlist, creating a universal device (UD) tree for representing the circuit topology, where the UD tree includes a hierarchical arrangement of UDs in multiple levels, calculating a time step for simulation, simulating the UD tree in accordance with the time step, and storing simulation results in a memory device.

BRIEF DESCRIPTION OF THE DRAWINGS

The aforementioned features and advantages of the invention, as well as additional features and advantages thereof, will be more clearly understandable after reading detailed descriptions of embodiments of the invention in conjunction with the following drawings.

DESCRIPTION OF EMBODIMENTS

Methods and systems are provided for simulating a circuit. The following descriptions are presented to enable any person skilled in the art to make and use the invention. Descriptions of specific embodiments and applications are provided only as examples. Various modifications and combinations of the examples described herein will be readily apparent to those skilled in the art, and the general principles defined herein may be applied to other examples and applications without departing from the spirit and scope of the invention. Thus, the present invention is not intended to be limited to the examples described and shown, but is to be accorded the widest scope consistent with the principles and features disclosed herein.

Some portions of the detailed description that follows are presented in terms of flowcharts, logic blocks, and other symbolic representations of operations on information that can be performed on a computer system. A procedure, computer-executed step, logic block, process, etc., is here conceived to be a self-consistent sequence of one or more steps or instructions leading to a desired result. The steps are those utilizing physical manipulations of physical quantities. These quantities can take the form of electrical, magnetic, or radio signals capable of being stored, transferred, combined, compared, and otherwise manipulated in a computer system. These signals may be referred to at times as bits, values, elements, symbols, characters, terms, numbers, or the like. Each step may be performed by hardware, software, firmware, or combinations thereof.

Figure 1:
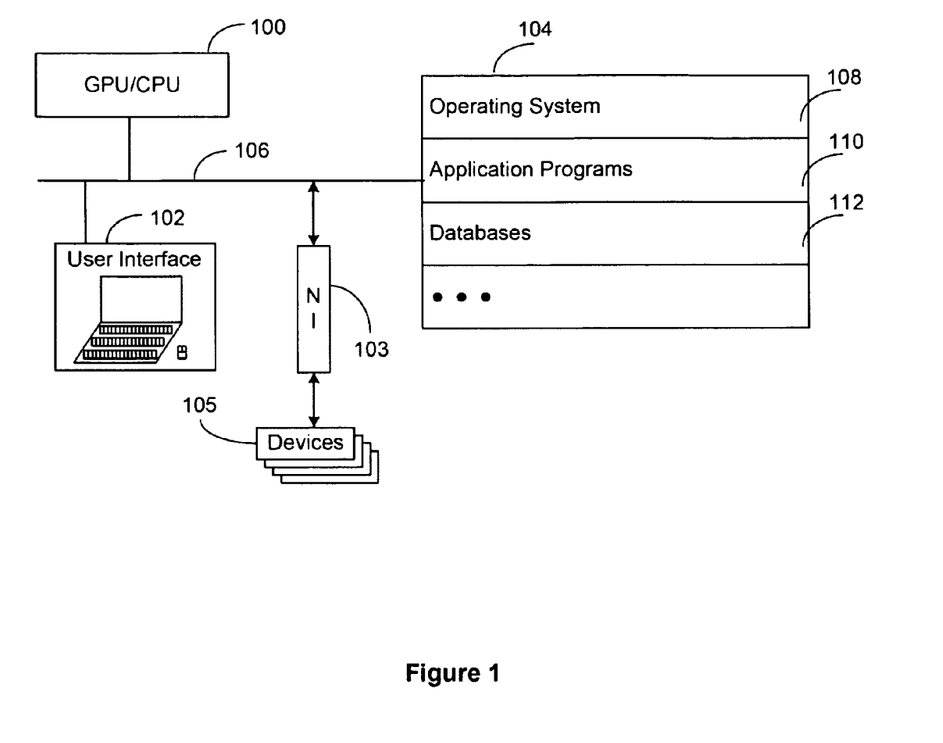
FIG. 1 illustrates a system for simulating a circuit according to an embodiment of the present invention.

FIG. 1 illustrates a system for simulating a circuit according to an embodiment of the present invention. In one embodiment, the method and system for simulating a circuit may be implemented using a computer system. The computer system may include one or more graphics processing units (GPUs) and/or central processing units (CPUs) 100, at least a user interface 102 for displaying computation results and waveforms, a memory device 104, a system bus 106, and one or more bus interfaces for connecting the GPUs/CPUs, user interface, memory device, and system bus together. The computer system also includes at least one network interface 103 for communicating with other devices 105 on a computer network. In alternative embodiments, certain functionalities of the method and system may be implemented in one or more application-specific integrated circuits (ASICs) or field-programmable gate arrays (FPGAs), thereby reducing the role of the GPU/CPU.

The memory device 104 may include high-speed random-access memory and may also include non-volatile memory, such as one or more magnetic disk storage devices. The memory device may also include mass storage that is located remotely from the GPUs/CPUs. The memory device preferably stores:

- an operating system 108 that includes procedures for handling various basic system services and for performing hardware-dependent tasks;
- application programs 110 for performing other user-defined applications and tasks, such as circuit simulations and device evaluations;
- databases 112 for storing information of the integrated circuit, the databases include data structures, device models, and matrices.

The databases, the application programs, and the program for simulating a circuit may include executable procedures, sub-modules, tables, and other data structures. In other embodiments, additional or different modules and data structures may be used, and some of the modules and/or data structures listed above may not be used.

It is a challenge in circuit simulation to handle large matrix size when a computer's physical memory is limited. The bottle neck is how to solve a discrete linear system. This situation becomes worse for nanometer designs because of the native properties in time domain analysis. Parallel LU decomposition is a method used in large and complex circuit simulation. In linear algebra, the LU decomposition is a matrix decomposition which writes a matrix as the product of a lower and upper triangular matrix. The product sometimes includes a permutation matrix as well. This decomposition is used in numerical analysis to solve systems of linear equations or calculate the determinant.

In general, LU decomposition consumes more computation time than solving the matrix. There are two methods commonly used for LU decomposition, namely the Left-Looking method and the Right-Looking method. For the Left-Looking method, LU decomposition is performed on a column-by-column basis. For example, when column j is processed, only data in columns to the left of column j($i<=j$) are needed. The following pseudo codes show a typically algorithm for implementing the Left-Looking method.

for column j=1 to n do
    f=A(:,j);
    Symbolic factor: determine which columns of L will update f;
    for each updating column r<j in topological order do
        Col-col update: f=f−f(r)·L(r+1:n, r);
    end for;
    Pivot: interchange f(j) and f(m), where |f(m)|=max|f(j:n)|:
    Separate L and U: U(1:j, j)=f(1:j); L(j:n, j)=f(j:n);
    Scale: L(:, j)=L(:, j)/L(j, j);
    Prune symbolic structure based on column j;
end for;

For the Right-Looking method, LU decomposition is performed in a left to right fashion (thus the name Right-Looking). The following pseudo codes show a typically algorithm for implementing the Right-Looking method.

Figure 2:
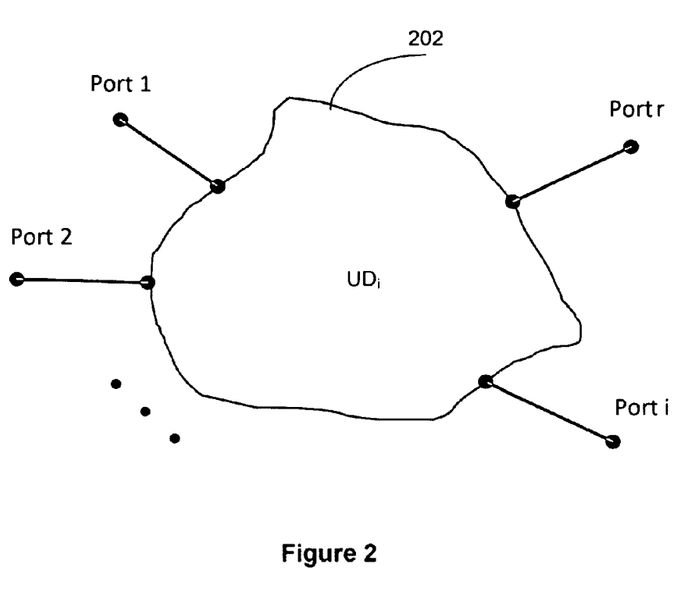
FIG. 2 illustrates an exemplary universal device according to embodiments of the present invention.

Loop k from 1 to N:
    Loop i from k+1 to N:

$$A(i,k)=A(i,k)/A(k,k);$$

endLoop
    Loop i from k+1 to N:
        Loop j from k+1 to N:

$$A(i,j)=A(i,j)-A(i,k)*A(k,j);$$

endLoop
    endLoop
endLoop Embodiments of the present invention employ a divide-and-conquer methodology that utilizes a universal device (UD) in performing LU decomposition of a matrix in parallel. In general, a UD is a physical domain that communicates with other physical domains through its ports. FIG. 2 illustrates an exemplary universal device according to embodiments of the present invention. A UD may be a device, a sub-circuit, a combination of devices, a combination of UDs, or any combination of the above.

As shown in FIG. 2, a UD 202 may be treated as a device with multiple ports, for example r ports. Its stamping matrix with dimension r×r may be formed by a method called the Schur complement. A UD may be added to a general simulation flow with an effort similar to adding a device.

Figure 3A:
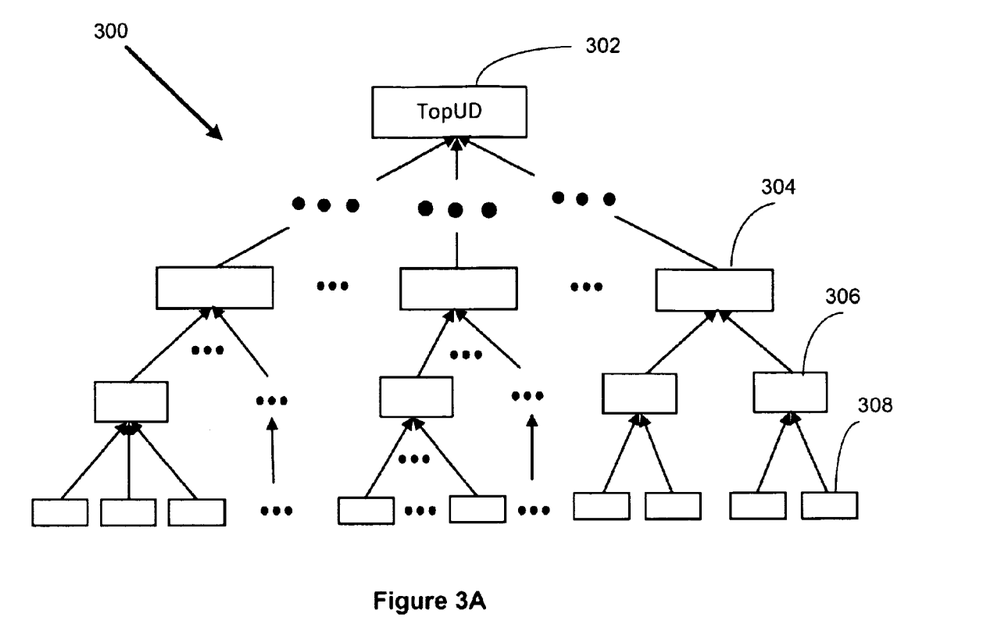
FIG. 3A illustrates an exemplary topology of a UD tree according to embodiments of the present invention.

FIG. 3A illustrates an exemplary topology of a UD tree according to embodiments of the present invention. In this example, a UD tree 300 may be used to represent an entire circuit in a hierarchical data structure having a TopUD 302, which in turn includes multiple levels of UDs, such as the three levels represented by UD blocks 304, 306, and 308 respectively. The TopUD 302 may be formed by recursively forming intermediate parent UDs (such as 304 and 306) in successive levels of the UD tree. In one approach, the UD tree may be built using a cluster analysis method as described below:

Starting from the bottom level, form clusters by analyzing the circuit topology;

After trimming, merging and modifying the clusters, define the modified clusters as UDs;

Assign UDs as leaves of the UD tree;

Merge a selected group of leaves to form a parent UD according to the corresponding port properties of the leaves;

Repeat the merge process to build the next level of the UD tree in a bottom up manner until the top level UD (TopUD) is formed.

Note that by the way the UD tree is formed, UDs in a certain level of the UD tree are independent of each other, and UDs in different hierarchical branches of the UD tree are independent of each other. As a result, processing of UDs in each level as well as processing of UDs in different hierarchical branches of the UD tree may be conducted in parallel during circuit simulation.

Figure 3B:
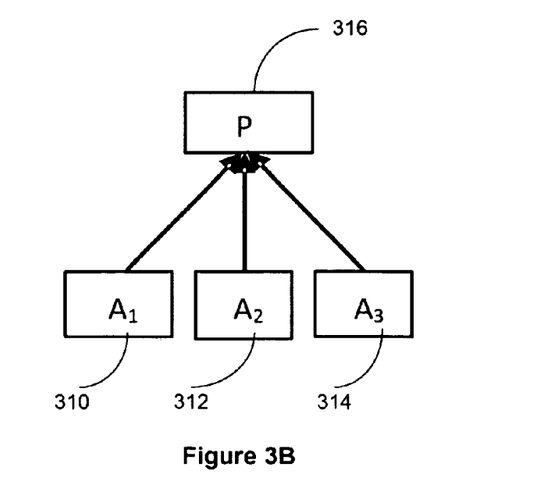
FIG. 3B illustrates a method for forming the UD tree of FIG. 3A using the Schur complement approach according to embodiments of the present invention.

FIG. 3B illustrates a method for forming the UD tree of FIG. 3A using the Schur complement approach according to embodiments of the present invention. In this example, assuming child UDs A1 310, A2 312, and A3 314 of a parent UD P 316 have ports D1, D2, and D3 respectively. The stamping matrix may be written as equation 1:

$$\begin{bmatrix} A_1 & & & B_1 \\ & A_2 & & B_2 \\ & & A_3 & B_3 \\ C_1 & C_2 & C_3 & D \end{bmatrix} \begin{bmatrix} x_1 \\ x_2 \\ x_3 \\ x_D \end{bmatrix} = \begin{bmatrix} b_1 \\ b_2 \\ b_3 \\ b_D \end{bmatrix}, \text{ where } C_i = T_i C_{Ai}, \quad (\text{Eq. 1})$$

$i = 1, \ldots, 3, B_i = B_{Ai} S_i, i = 1, \ldots, 3, T_i, S_i,$ $i = 1, \ldots, 3,$ are map matrix for $A_i$'s port to $D$.

where D represents ports of child UDs $A_1$ 310, $A_2$ 312, and $A_3$ 314, and it may be written in stamping format as shown in equation 2:

$$D = \sum_{i=1}^{3} T_i D_{Ai} S_i, i = 1, \ldots, 3, \text{ where } D_{Ai} \text{ is } A_i \text{ ports'} \quad (\text{Eq. 2})$$

stamping matrix expressed in $A_i$'s order.

through numerical transformation, equation 1 may be rewritten as equation 3.

$$\begin{bmatrix} A_1 & & & B_1 \\ & A_2 & & B_2 \\ & & A_3 & B_3 \\ 0 & 0 & 0 & D - \sum_{i=1}^{3} C_i A_i^{-1} B_i \end{bmatrix} \begin{bmatrix} x_1 \\ x_2 \\ x_3 \\ x_D \end{bmatrix} = \begin{bmatrix} b_1 \\ b_2 \\ b_3 \\ b_D - \sum_{i=1}^{3} C_i A_i^{-1} b_i \end{bmatrix} \quad (\text{Eq. 3})$$

where $$D - \sum_{i=1}^{3} C_i A_i^{-1} B_i$$

is the Schur complement, which may be rewritten as:

$$D - \sum_{i=1}^{3} C_i A_i^{-1} B_i = \quad (\text{Eq. 4})$$

$$\sum_{i=1}^{3} T_i D_{Ai} S_i - \sum_{i=1}^{3} T_i C_{Ai} A_i^{-1} B_{Ai} S_i = \sum_{i=1}^{3} T_i (D_{Ai} - C_{Ai} A_i^{-1} B_{Ai}) S_i$$

Note that $D_{Ai} - C_{Ai} A_i^{-1} B_{Ai}$ is the Schur compliment of Ai's, Ti and Si are stamping operators, and $$D - \sum_{i=1}^{3} C_i A_i B_i$$

is a parent UD's stamping matrix.

Figure 4:
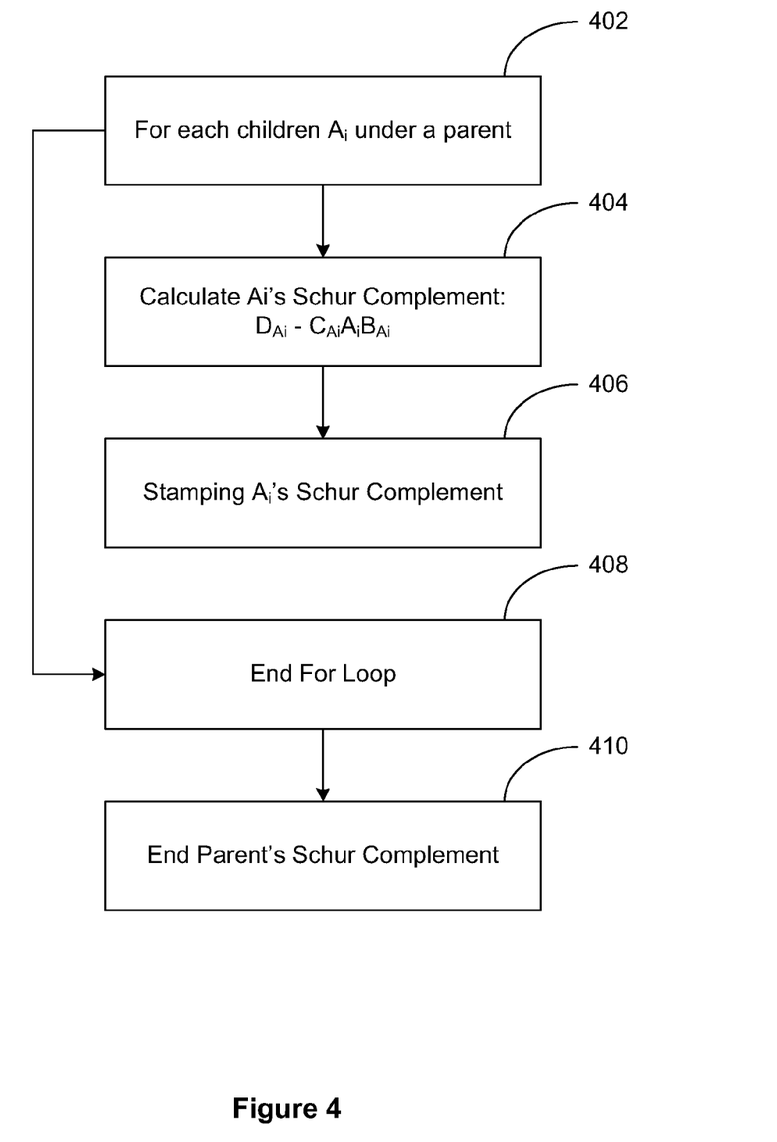
FIG. 4 illustrates a method for forming a parent UD's stamping matrix according to embodiments of the present invention.

FIG. 4 illustrates a method for forming a parent UD's stamping matrix according to embodiments of the present invention. In this example, the method starts in block 402 where the method enters a loop for forming a parent UD's stamping matrix. If the method has not reached the end of the loop, it starts processing each child UD under the parent UD and continues to block 404. In block 404, the method calculates the child UD's Schur complement. After obtaining the child UD's Schur complement, in block 406 the method stamps the child UD's Schur complement. In block 402, if the method has reached the end of the loop, it continues to block 408. In block 410, the process for forming a parent UD's stamping matrix is ended.

Note that since a newly formed parent UD is considered as a new UD, its stamping matrix is the Schur complement. If the newly formed parent UD is a child of another UD, the procedure described in FIG. 4 is applied repetitively until the TopUD is formed. After forming the UD tree, the entire circuit may be solved in a bottom up manner one level at a time. The Schur complement method described above may also be applied in solving the UD tree. According to embodiments of the present invention, two or more UDs may be solved in parallel if they do not share a common child. A UD is available to be selected for solving if its child (children) UD(s) have been processed. The order of solving a UD may be determined based on computation costs associated with solving the UD. In one approach, the available UD with the highest computation costs is to be solved first.

In solving UDs in the tree, multiple UDs may be assigned to corresponding multiple blocks of threads to be executed by multiple processors in parallel. The UD tree created in FIG. 3A enables different thread management methodologies to be applied for processing the UDs in parallel. For example, the processing of UDs may be conducted in a static, dynamic, vertical, horizontal, and/or combination these methodologies.

According to embodiments of the present invention, the UD static management method processes UDs in a predefined sequence. This predefined sequence does not change during the simulation. The UD dynamic management method processes UDs in the sequence based on dynamic events occurred during the simulation. The UD horizontal management method processes UDs according the level of the UDs in the tree. In this approach, leaves in the bottom level are processed first, then the UDs in the second level are processed next. The process continues until the top level UD (TopUD) is processed. The UD vertical management method processes UD with a depth-first approach. The depth-first approach processes a parent UD after its children UDs have been processed. This approach takes advantages of the hierarchical memory structure in tackling memory intensive computations.

Figure 5:
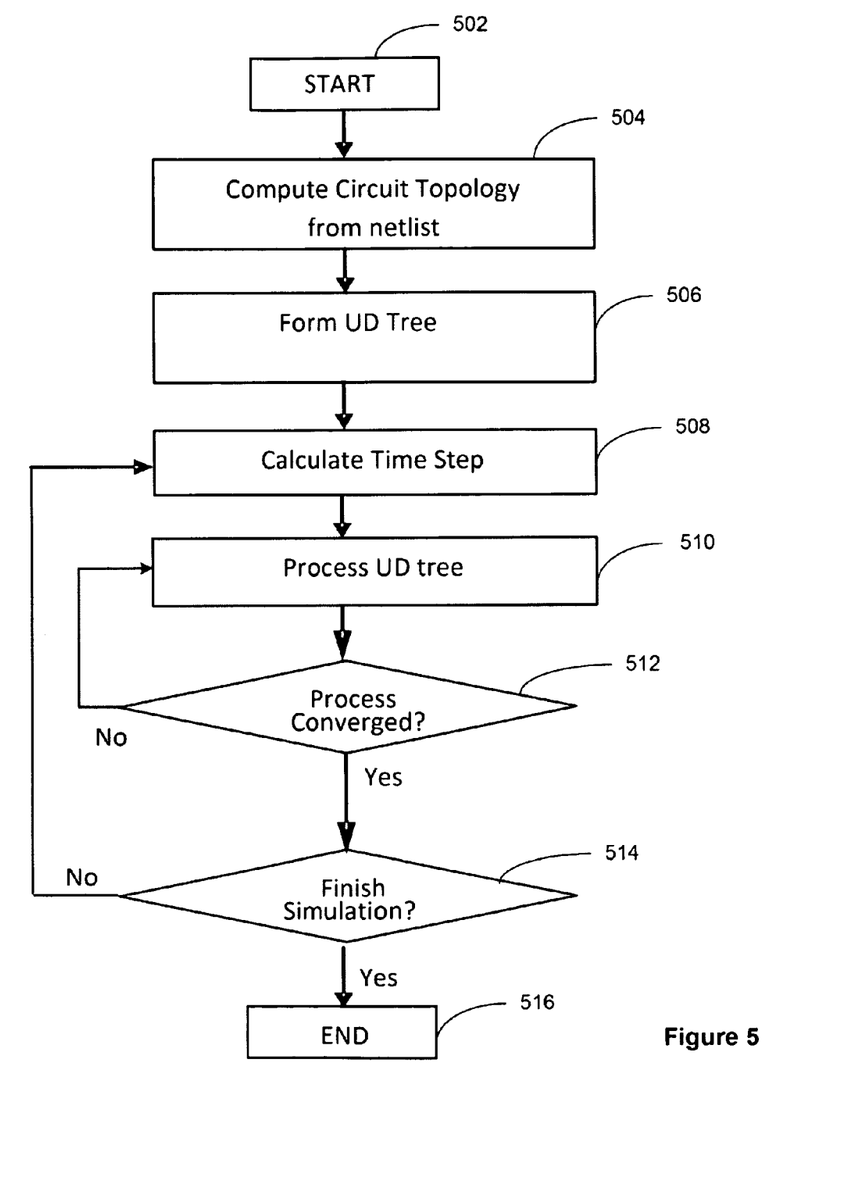
FIG. 5 illustrates a method for simulating a circuit according to embodiments of the present invention.

FIG. 5 illustrates a method for simulating a circuit according to embodiments of the present invention. As shown in FIG. 5, the simulation flow starts in block 502 and then moves to block 504 where the method computes a circuit topology from the circuit netlist. In block 506, the method forms a UD tree using the circuit topology computed in block 504. The method employs a partition method to form a matrix having multiple sub-matrices that corresponds to the circuit topology. Then, the method forms the UD tree in a bottom up manner using the matrix. In block 508, the method calculates a time step to be used for processing the UD tree. Note that, during the simulation, different time steps may be used. The method may determine a time step that is more suitable for an active part of the circuit as opposed to an inactive part of the circuit. In block 510, the method processes the UD tree. In processing the UD tree, multiple UDs may be processed in parallel as long as the UDs being processed are independent of each other. In block 512, a first determination is made as to whether the process of the UD tree has converged. In one approach, the Newton iteration process may be used in processing the UD tree and the convergence of the Newton iteration process is determined in block 512. In another approach, the time-step iteration process may be used in processing the UD tree, and in that case the convergence of the time-step iteration process is determined in block 512. The method moves to block 514 (512_Yes) if the process has converged. The method continues to process the UD tree in block 510 (512_No) if the process has not converged. In block 514, a second determination is made as to whether the simulation is finished. The method continues to block 508 (514_No) if the simulation is not finished. The method moves to block 516 (514_Yes) if the simulation is finished. The simulation flow ends in block 516.

Figure 6:
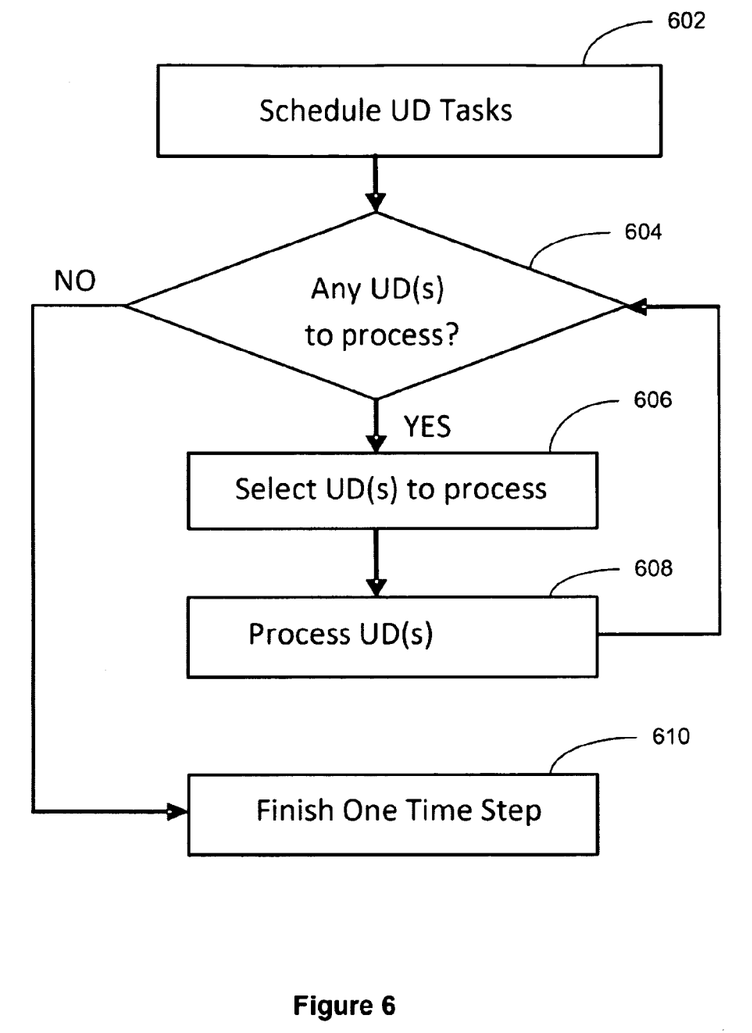
FIG. 6 illustrates a method for processing a UD tree according to embodiments of the present invention.

FIG. 6 illustrates a method for processing a UD tree according to embodiments of the present invention. This example shows the processing of a UD tree for one time step. The method starts in block 602 where it schedules UD tasks. In one approach, the method may form a UD stack for processing the UDs in the UD tree. In block 604, the method determines whether there are any UD(s) to process. If there are UD(s) to process (604_Yes), the method continues in block 606 where it selects UD(s) for processing. In block 608, the method processes the UD(s). After processing the UD(s), the method continues in block 604. If there are no UD(s) to process (604_No), the method moves to block 610 and ends the processing of the UD tree for one time step.

In processing UDs, the method solves or partially solves a system of linear equations for leaf UDs or parent UDs. For example, consider the case where a matrix A with dimension n×n is modified by a unsymmetric matrix of rank-one as $$\bar{A}=A+\alpha u v^T \qquad \text{(Eq. 5)}$$

in which, α is a parameter, u and v are vectors with dimension n. Assuming that A is decomposed as A=LU for determining its factors $$\bar{A}=\bar{L}\bar{U} \qquad \text{(Eq. 6)}$$

Through a transformation, equation 5 can be rewritten as:

$$\bar{A}=A+\alpha u v^T=L(I+\alpha p q^T)U, \text{ where } Lp=z, q^T U=v^T \qquad \text{(Eq. 7)}$$

if the factorization is formed $$I+\alpha p q^T=\tilde{L}\tilde{U}^T \qquad \text{(Eq. 8)}$$

the modified Cholesky factors become the form $$\bar{K}=L\tilde{L}\tilde{U}U, \text{ given } \bar{L}=L\tilde{L} \text{ and } \bar{U}=\tilde{U}U \qquad \text{(Eq. 9)}$$

This is because the product of two lower-triangular matrices is a lower triangular matrix. Here, $\tilde{L}$ is a structured matrix, $\tilde{L}\tilde{U}$ may be calculated through $O(n^2)$ operations. Thus the total operation to factor equation 5 through update is $O(n^2)$ while the total operation to factor equation 5 through direct method is $O(n^3)$. The manner in which the factorization of equation 8 is performed may increase processing efficiency to $O(n^2)$ instead of $O(n^3)$ by structured matrix multiplication.

Note that conventional circuit simulation methods need to calculate LU for every time step or Newton iteration. According to embodiments of the present invention, an approach for computing LU through updates based on LU of previous time step is described in the following section.

Figure 7:
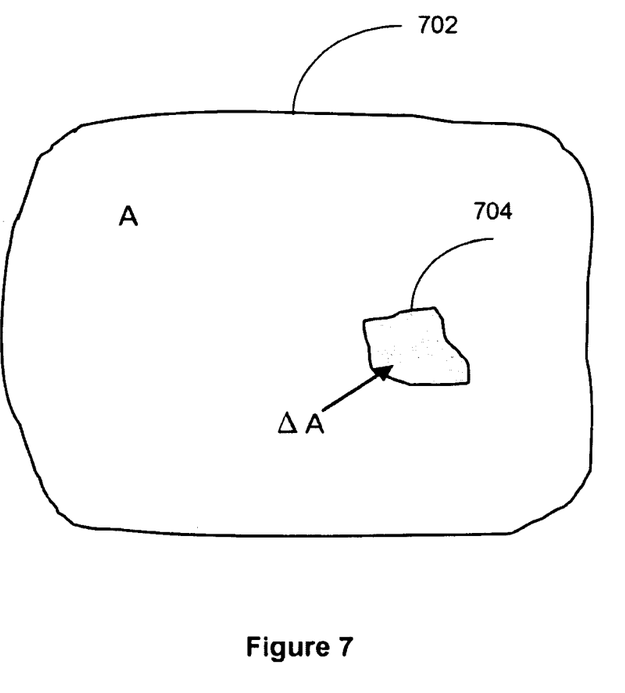
FIG. 7 illustrates a method for performing rank-one update according to embodiments of the present invention.

FIG. 7 illustrates a method for performing rank-one update according to embodiments of the present invention. In the example shown in FIG. 7, a simulation matrix A 702 may be represented as a reference matrix A0 plus a difference ΔA 704:

$$A=A0+\Delta A$$

where the reference matrix A0 is the simulation matrix in the former time step, and ΔA 704 represents a part of the matrix that has changed its states between the previous and current time steps. From the intrinsic properties of circuit, ΔA 704 is typically highly sparse and low rank.

According to embodiments of the present invention, there are two ways to form ΔA. The first way is to use mathematical computations as shown below.

$$\Delta A=A-A0$$

The second way is to use physical measurements. In this approach, the active region is defined using the device models. Then ΔA can be assembled from the stamping procedure described below.

First, the stamping procedure forms ΔA. Note that the time required for forming ΔA is shorter than the time required for forming a full matrix. This is because in the former case only active nodes in the circuit are considered. The method to choose active nodes can be based on 1) rate of voltage change, 2) rate of voltage change versus time, 3) rate of current change, 4) Newton convergence criteria, 5) time steps convergence criteria, and 6) estimated current of the active nodes.

Next, suppose ΔA have r ranks. ΔA may be decomposed as summation of rank-one's $$\Delta A = \sum_{i=1}^{r} u_i v_i^T$$

Note that methods for decomposing ΔA include, but not limited to, singular value decomposition (SVD) and primary elementary matrix computation. Using SVD decomposition as an example, ΔA may be expressed as:

$$\Delta A=U\Sigma V^T, \text{ where } U, V \text{ are orthogonal matrices, } \Sigma \text{ is diagonal matrix.}$$

Then, the ΔA expression may be written as:

$$\Delta A = \sum_{i=1}^{r} (\sigma_i u_i)(v_i^T), \text{ where } \sigma_i \text{ is } i^{th} \text{ diagonal in } \sum,$$

$u_i$ and $v_i$ are the $i^{th}$ column in $U$ and $V$.

In other embodiments, ΔA may also be formed by mathematical transformation. For example, ΔA can be expressed as:

$$\Delta A = [\, a_0 \quad a_1 \quad a_2 \quad \ldots \quad a_r\,] = \sum_{i=0}^{i=r} a_i e_i^T,$$

where $a_i$, i=1, ..., r with r is the rank of ΔA
$e_i$ is a vector has 1 in $i^{th}$ entry while all other entries are 0.
Next, the stamping procedure updates LU. Instead of decompose matrix A, the LU may be computed as follows:

$$A_i = A_{i-1} + \Delta A$$

$$= A_{i-1} + \sum_{i=1}^{r} U_i V_i^T = L_{i-1} U_{i-1} + \sum_{i=1}^{r} U_i V_i^T = L_i U_i$$

In which, $L_i U_i$ is obtained by recursively calling the rank-one update method described above.

Figure 8A:
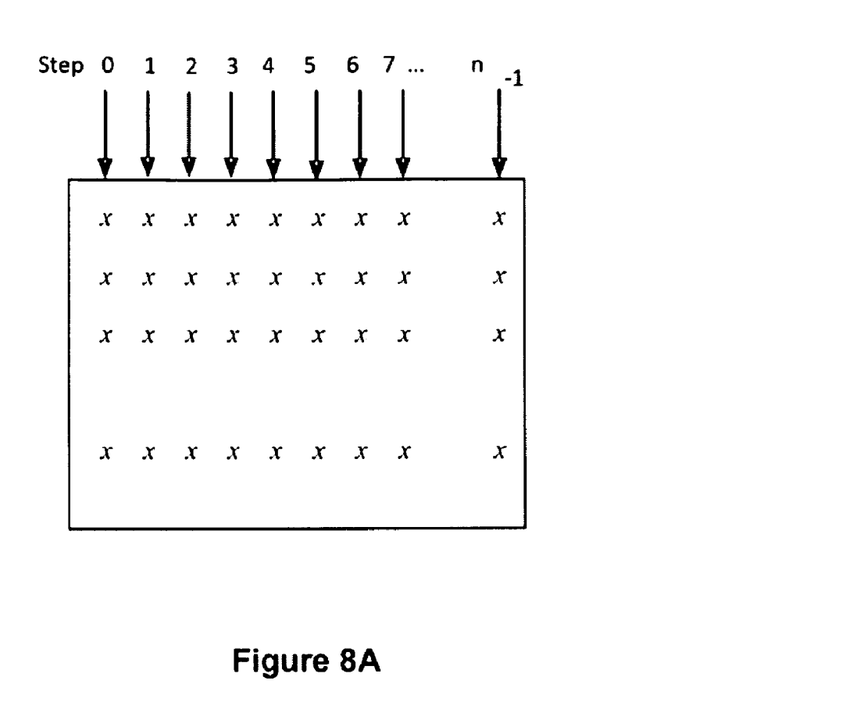
FIGS. 8A and 8B illustrate methods for conducting rank-one update in parallel according to embodiments of the present invention.
Figure 8B:
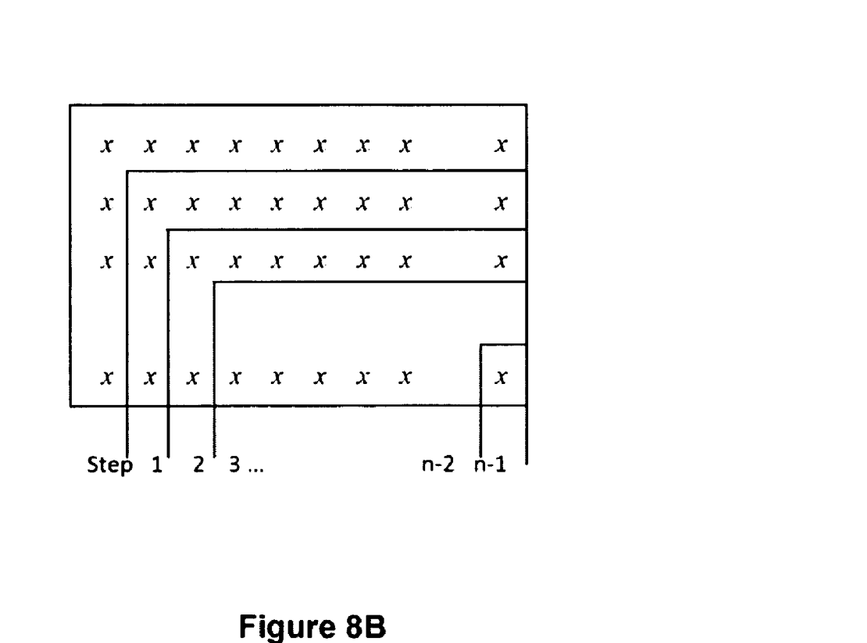

FIGS. 8A and 8B illustrate methods for conducting rank-one update in parallel according to embodiments of the present invention. As shown in FIG. 8A, matrices L and U with dimension n×n may be updated from the first column (column 0) to the last column (column n−1) in a pipelined manner. Similarly as shown in FIG. 8B, matrices L and U with dimension n×n may be updated from top-left to bottom-right for each clock cycle in a pipelined manner. Since the rank-one update sequence is performed in one direction, after a column is processed, it would not be used for the processing of subsequent columns. Suppose there are k ranks to be updated, a pipelined approach may be employed to update the k ranks in parallel.

Figure 9:
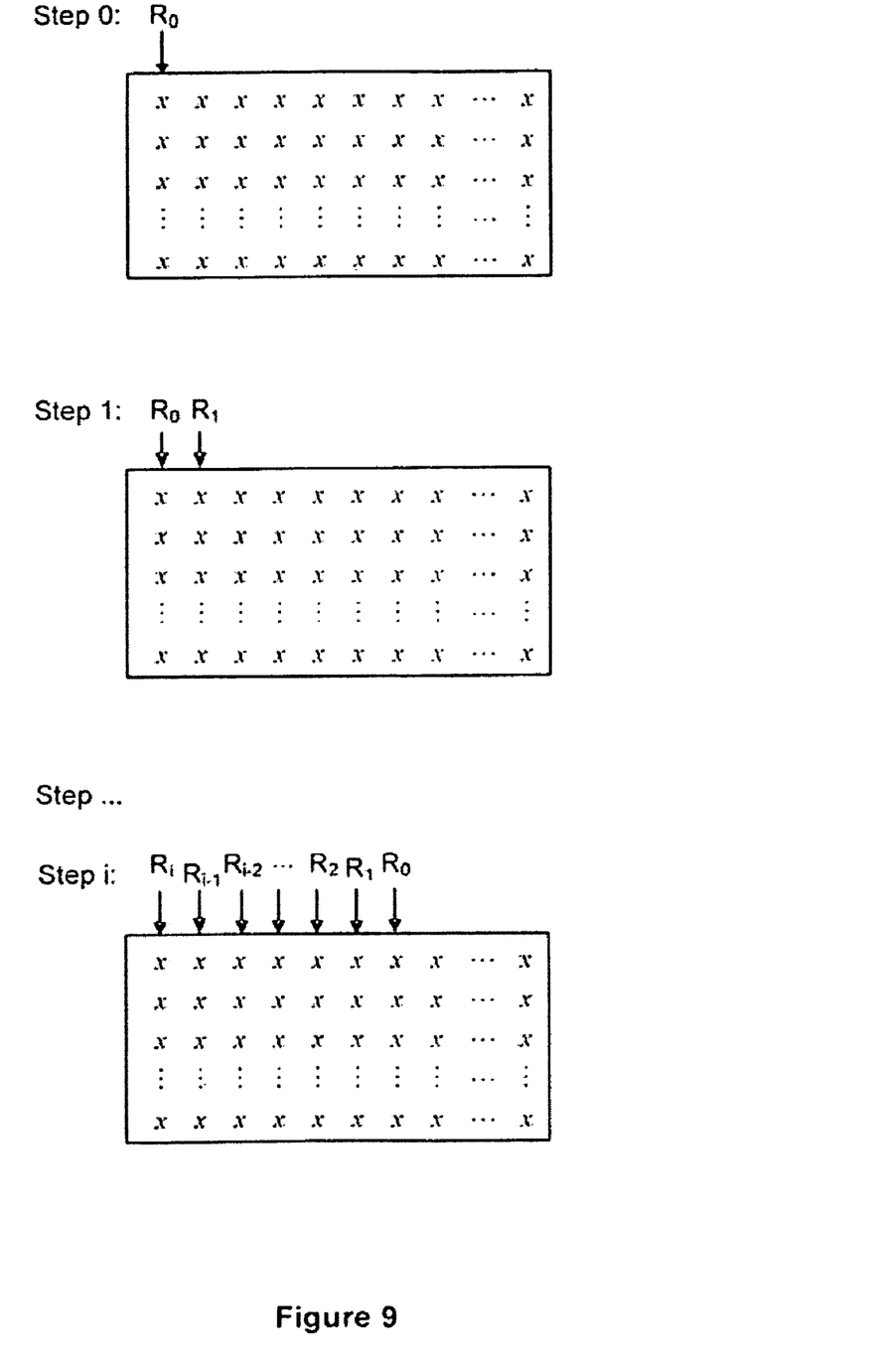
FIG. 9 illustrates a method for conducting multiple rank-one updates in parallel according to embodiments of the present invention.

FIG. 9 illustrates a method for conducting multiple rank-one updates in parallel according to embodiments of the present invention. In the example of FIG. 9, Ri refers to the $i^{th}$ rank to be updated in matrix $A_0$. Through a pipelined process, the method may simulate the update of multiple ranks in parallel using multiple CPUs, multi-core CPUs, GPUs, and stream processors, or any combination of these processors. Specifically, in step 0, the $0^{th}$ rank of matrix $A_0$ is updated. In step 1, the $0^{th}$ and $1^{st}$ ranks of the matrix $A_0$ are updated in parallel. Similarly in step i, the $0^{th}$ to $i^{th}$ ranks of the matrix $A_0$ are updated in parallel.

In addition to circuit simulation, methods described above may be applied to other fields such as analyses involving time domain and non-linear systems, including but not limited to, fluid dynamics, aerospace, chemical processing, structure analysis, graphics rendering, MEMS, seismic, biotech, and electromagnetic field analyses.

It will be appreciated that the above description for clarity has described embodiments of the invention with reference to different functional units and processors. However, it will be apparent that any suitable distribution of functionality between different functional units or processors may be used without detracting from the invention. For example, functionality illustrated to be performed by separate processors or controllers may be performed by the same processors or controllers. Hence, references to specific functional units are to be seen as references to suitable means for providing the described functionality rather than indicative of a strict logical or physical structure or organization.

The invention can be implemented in any suitable form, including hardware, software, firmware, or any combination of these. The invention may optionally be implemented partly as computer software running on one or more data processors and/or digital signal processors. The elements and components of an embodiment of the invention may be physically, functionally, and logically implemented in any suitable way. Indeed, the functionality may be implemented in a single unit, in a plurality of units, or as part of other functional units. As such, the invention may be implemented in a single unit or may be physically and functionally distributed between different units and processors.

One skilled in the relevant art will recognize that many possible modifications and combinations of the disclosed embodiments may be used, while still employing the same basic underlying mechanisms and methodologies. The foregoing description, for purposes of explanation, has been written with references to specific embodiments. However, the illustrative discussions above are not intended to be exhaustive or to limit the invention to the precise forms disclosed. Many modifications and variations are possible in view of the above teachings. The embodiments were chosen and described to explain the principles of the invention and their practical applications, and to enable others skilled in the art to best utilize the invention and various embodiments with various modifications as suited to the particular use contemplated.

What is claimed is:

1. A computer-implemented method for simulating a circuit, comprising:
    representing a circuit using a matrix, wherein the matrix represents a set of linear equations to be solved;
    identifying a delta matrix, wherein the delta matrix is a difference of the matrix that changed states from a previous time step to a current time step;
    computing an update of the delta matrix using a matrix decomposition approach, wherein computing the delta matrix update comprises updating a representation of the delta matrix from a first column to a last column in a pipelined manner and updating the representation of the delta matrix from top-left to bottom-right in a pipelined manner;
    generating a current state of the matrix using a previous state of the matrix and the update of the delta matrix; and
    storing the current state of the matrix in a memory device, wherein the computer-implemented method is executed by a plurality of processors operating in parallel, thereby simulating a model of said circuit.

2. The computer-implemented method of claim 1, wherein identifying a delta matrix comprises:
    identifying active nodes in accordance with at least one of:
    rate of voltage change,
    rate of voltage change versus time,
    rate of current change,
    and
    estimated current of the active nodes.

3. The computer-implemented method of claim 1, wherein computing an update of the delta matrix comprises:
    decomposing the delta matrix in accordance to ranks of the delta matrix;
    summing contributions from each rank of the delta matrix.

4. The computer-implemented method of claim 1, wherein computing an update of the delta matrix further comprises:
    decomposing the delta matrix to form a diagonal matrix and orthogonal matrices;
    expressing the diagonal matrix and orthogonal matrices using ranks of the delta matrix; and
    summing contributions from each rank of the delta matrix.

5. The computer-implemented method of claim 1, wherein representing a circuit using a matrix comprises:
   computing a circuit topology of the circuit;
   forming a universal device (UD) tree for representing the matrix, wherein the UD tree includes a plurality of universal devices arranged in multiple levels in a hierarchical data structure, wherein a UD at a higher level includes ports of its corresponding child UDs, and wherein UDs in a level of the UD tree are independent of each other.

6. The computer-implemented method of claim 5, wherein forming a UD tree comprises:
   computing a Schur complement of each UD; and
   stamping the Schur complement of each UD to the matrix.

7. The computer-implemented method of claim 5, wherein forming a UD tree further comprises at least one of:
   processing UDs according to a predefined sequence;
   processing UDs according to dynamic events occurred;
   processing UDs in a bottom-up manner according to their corresponding levels in the UD tree; and
   processing UDs in a depth-first manner according to positions of the UDs in the UD tree.

8. The computer-implemented method of claim 1, wherein the computer-implemented method is described as a computer program product stored in a non-transitory medium comprising executable program code, which when executed, performs the method of claim 1.

9. A system for solving a matrix, comprising:
   a graphics processing unit (GPU), wherein the GPU comprises one or more multiprocessors and each multiprocessor includes a plurality of processors and a shared memory configured to be used by the plurality of processors;
   a graphical-user-interface for viewing representations of the matrix on a display;
   a global memory for storing information related to the matrix;
   logic for representing a circuit using the matrix, wherein the matrix represents a set of linear equations to be solved;
   logic for identifying a delta matrix, wherein the delta matrix is a difference of the matrix that changed states from a previous time step to a current time step;
   logic for computing an update of the delta matrix using a matrix decomposition approach, wherein computing the delta matrix update comprises updating a representation of the delta matrix from a first column to a last column in a pipelined manner and updating the representation of the delta matrix from top-left to bottom-right in a pipelined manner;
   logic for generating a current state of the matrix using a previous state of the matrix and the update of the delta matrix; and
   logic for storing the current state of the matrix in a memory device.

10. The system of claim 9, wherein the logic for identifying a delta matrix comprises:
    logic for identifying active nodes in accordance with at least one of:
    rate of voltage change,
    rate of voltage change versus time,
    rate of current change,
    and
    estimated current of the active nodes.

11. The system of claim 9, wherein the logic for computing an update of the delta matrix comprises:
    logic for decomposing the delta matrix in accordance to ranks of the delta matrix;
    logic for summing contributions from each rank of the delta matrix.

12. The system of claim 9, wherein the logic for computing an update of the delta matrix further comprises:
    logic for decomposing the delta matrix to form a diagonal matrix and orthogonal matrices;
    logic for expressing the diagonal matrix and orthogonal matrices using ranks of the delta matrix; and
    logic for summing contributions from each rank of the delta matrix.

13. The system of claim 9, wherein the logic for representing behaviors of a system using a matrix comprises:
    logic for computing a circuit topology of the circuit;
    logic for forming a universal device (UD) tree for representing the matrix, wherein the UD tree includes a plurality of universal devices arranged in multiple levels in a hierarchical data structure, wherein a UD at a higher level includes ports of its corresponding child UDs, and wherein UDs in a level of the UD tree are independent of each other.

14. The system of claim 13, wherein the logic for forming a UD tree comprises:
    logic for computing a Schur complement of each UD; and
    logic for stamping the Schur complement of each UD to the matrix.

15. The system of claim 13, wherein the logic for forming a UD tree further comprises at least one of:
    logic for processing UDs according to a predefined sequence;
    logic for processing UDs according to dynamic events occurred;
    logic for processing UDs in a bottom-up manner according to their corresponding levels in the UD tree; and
    logic for processing UDs in a depth-first manner according to positions of the UDs in the UD tree.

16. A method for simulating a circuit, comprising:
    receiving a description of the circuit in a netlist; computing an update of a delta matrix associated with the circuit using a matrix decomposition approach, wherein computing the delta matrix update comprises updating a representation of the delta matrix from a first column to a last column in a pipelined manner and updating the representation of the delta matrix from top-left to bottom-right in a pipelined manner;
    computing a circuit topology from the netlist;
    creating a universal device (UD) tree for representing the circuit topology, wherein the UD tree includes a plurality of universal devices arranged in multiple levels in a hierarchical data structure, wherein a UD at a higher level includes ports of its corresponding child UDs, and wherein UDs in a level of the UD tree are independent of each other;
    calculating a time step for simulation;
    simulating the UD tree in accordance with the time step; and
    storing simulation results in a memory device.

17. The method of claim 16, wherein simulating the UD tree comprises:
    scheduling tasks to process UDs according to the UD tree, wherein the UDs are arranged in a stack;
    selecting one or more UDs from the stack; and
    processing the one or more UDs; and
    repeating steps (a) and (b) until all UDs in the stack have been processed.

* * * * *